(12) United States Patent
Hwang et al.

(10) Patent No.: US 7,494,845 B2
(45) Date of Patent: Feb. 24, 2009

(54) METHOD OF FORMING A THIN WAFER STACK FOR A WAFER LEVEL PACKAGE

(75) Inventors: Hyeon Hwang, Chungcheongnam-do (KR); Ki-Kwon Jeong, Chungcheongnam-do (KR)

(73) Assignee: Samsung Electronics Co., Ltd., Suwon-si, Gyeonggi-di (KR)

( * ) Notice: Subject to any disclaimer, the term of this patent is extended or adjusted under 35 U.S.C. 154(b) by 189 days.

(21) Appl. No.: 11/144,213

(22) Filed: Jun. 2, 2005

(65) Prior Publication Data
US 2005/0282374 A1    Dec. 22, 2005

(30) Foreign Application Priority Data
Jun. 22, 2004    (KR) .................. 10-2004-0046558

(51) Int. Cl.
*H01L 21/00*    (2006.01)
(52) U.S. Cl. ............... 438/109; 438/455; 438/459; 257/E21.122
(58) Field of Classification Search ............ 438/107, 438/109, 118, 406, 455, 613, 459, 618, 667; 257/E21.122, 621, 774, 777, E21.001, E23.141
See application file for complete search history.

(56) References Cited

U.S. PATENT DOCUMENTS 5,432,999 A  *  7/1995  Capps et al. ............... 438/109
5,618,752 A  *  4/1997  Gaul ......................... 438/626
6,642,081 B1 * 11/2003  Patti ......................... 438/109

FOREIGN PATENT DOCUMENTS

| JP | 2003-124147 | 4/2003 |
|---|---|---|
| KR | 2001-0054575 | 7/2001 |
| KR | 2002-0024624 | 4/2002 |

OTHER PUBLICATIONS

English language abstract of the Korean Publication No. 2001-0054575.
English language abstract of the Korean Publication No. 2002-0024624.
English language abstract of the Japanese Publication No. 2003-124147.

* cited by examiner

*Primary Examiner*—Khiem D. Nguyen
(74) *Attorney, Agent, or Firm*—Marger Johnson & McCollom, P.C.

(57) ABSTRACT

A method of forming a stack of thin wafers provides a wafer level stack to greatly reduce process time compared to a method where individually separated chips are stacked after a wafer is sawed. A rigid planar wafer support member stabilizes and planarizes each wafer while it is thin or its thickness is reduced and during subsequent wafer processing. Thinned wafers are stacked and the external support members are removed by applying heat or ultraviolet (UV) light to an expandable adhesive layer between the support members and the thin wafers. The stacked wafers then can be further processed and packaged without thin-wafer warping, cracking or breaking. A wafer level package made in accordance with the invented method also is disclosed.

23 Claims, 6 Drawing Sheets

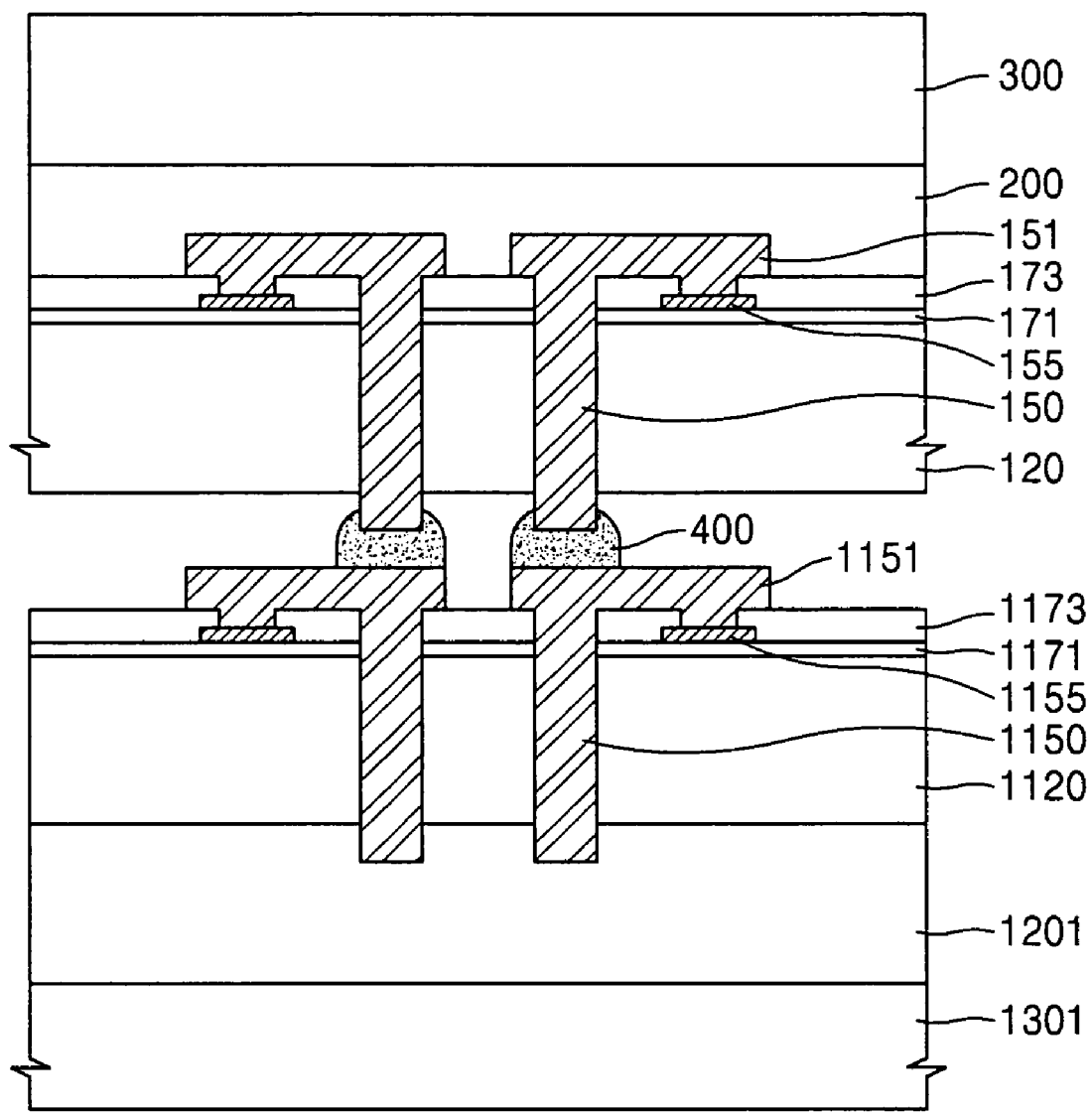

METHOD OF FORMING A THIN WAFER STACK FOR A WAFER LEVEL PACKAGE

BACKGROUND OF THE INVENTION

This application claims the priority of Korean Patent Application No. 2004-46558, filed on Jun. 22, 2004, in the Korean Intellectual Property Office, the disclosure of which is incorporated herein in its entirety by reference.

FIELD OF THE INVENTION

The invention relates to a method of manufacturing a semiconductor, and more particularly, to a method of forming a wafer stack to employ in a wafer level package.

DESCRIPTION OF THE RELATED ART

At present, various methods of packaging a semiconductor device chip of an integrated circuit are provided in a semiconductor manufacture technology. Many semiconductor device packaging technologies require a thin chip having a thickness of several tens of μm for high density integration.

For example, in a manufacture technology relating to multi-chip packaging (MCP) or multi-stack packaging (MSP), very thin chips are required to make chip stacks. Further, when an ultra-thin package is manufactured, one or more extremely thin chips each having a thickness of less than approximately 50 μm, for example, typically are used.

In order to make thin chip stacks or package the thin chip as described above, a wafer thinning process is first performed. However, it is very difficult to reduce the chip's thickness via a wafer thinning process. For example, if the wafer is thinned below approximately 50 μm, the thin wafer tends to warp and become non-planar. A warped wafer is very difficult to process, as required, since wafer processing assumes good wafer planarity. For example, sawing or dicing a wafer requires that the wafer conform to the plane of a work surface on which the sawing or dicing is performed. Further, warped wafers tend easily to crack or break. Also, it is very difficult to process thin wafers to form a package where two or more semiconductor device chips are layered or stacked.

Accordingly, a method of preventing a thin wafer from warping is needed to accomplish thin wafer processing.

SUMMARY OF THE INVENTION

The invention provides a method of forming a thin wafer stack, i.e. a layered arrangement of thin wafers having interconnected integrated circuits thereon.

The invented method of forming a stack of wafers, the method includes: providing a first wafer to produce one or more instances of a first bump each instance including a rear end thereof that extends outwardly from an interior region thereof and further including a front end thereof that protrudes beyond a front surface of the first wafer; affixing a first planar support member to the front surface of the first wafer; reducing the first wafer in thickness by removing sufficient material from a rear surface thereof to form a first thin wafer including a new rear surface and that includes protruding from the new rear surface thereof the one or more rear ends of the one or more instances of the first bump; providing a second thin wafer to produce one or more instances of a second bump each instance including a front end thereof that protrudes beyond the front surface of the second wafer; aligning and joining the first thin wafer to the second wafer so that the protruded rear end of one or more instances of the first bump is electrically connected to the protruded front end of the one or more instances of the second bump; and removing the support from the first thin wafer.

Those of skill in the art will appreciate that, preferably, the plural instances of the second bump further extends through an interior region of the second thin wafer to protrude also from a rear surface thereof to permit a third thin wafer to be similarly stacked therebeneath. The second thin wafer can be rendered thin and the second bump protruded from a rear surface thereof in a similar manner to that of the first thin wafer, e.g. by removing sufficient material from the rear surface of the second wafer to cause the one or more rear ends of the one or more second bumps to protrude from the new rear surface thereof. Preferably, during the thinning, material-removing processing of the second wafer, the second wafer is supported by affixing a second planar support member to the rear surface of the second wafer.

The one or more support members preferably take the form of one or more glass plates that are adhered temporarily to the respective wafers during the thinning thereof, which preferably is achieved by a sequence of grinding and etching steps. Adherence can be achieved by the use of expandable adhesive tape. After the thinning and preferably also after the joining steps, removal of the one or more support members can include applying heat or irradiating ultraviolet (UV) into the expandable adhesive tape to remove the expandable adhesive tape along with the support members.

The aligning and joining of the thin wafers can include attaching an anisotropic conductive film (ACF) between the first thin wafer and the second thin wafer; and pressing and joining the second wafer to the first thin wafer.

Alternatively, the aligning and joining of the thin wafers can include coating an anisotropic conductive paste (ACP) on the second wafer; and aligning and pressing and joining the first thin wafer to the second wafer, and then curing the ACP.

Alternatively, the aligning and joining of the first thin wafer can include selectively coating a solder paste on the one or more protruded front ends of the one or more second bumps opposite the one or more protruded lower ends of the first bump; and contacting the lower end of the one or more first bumps with the coated solder paste and reflowing the coated solder paste to form an electrical junction to electrically connect and join the one or more first bumps and the respective one or more second bumps.

Those of skill in the art will appreciate that, preferably, there are prepared a plurality of first and corresponding second bumps, with at least one pair of first and second bumps per circuit on the stacked wafers. Also preferably, to reduce warping of the thin first and second wafers, the pairs of first and second bumps are relatively evenly spread across the two-dimensional surfaces of the wafers. Thus the first and second bump pairs add needed planarizing support to the individual and stacked wafers while the wafers are being prepared, thinned, aligned and joined, thereby greatly reducing their tendency to warp.

Reducing the thickness of the first thin wafer can include: grinding the back surface of the first wafer opposite to the first support member to expose a surface of the lower end of the first bump and selectively etching the back surface of the ground first thin wafer to protrude the lower end of the first bump from the back surface of the first thin wafer. Reducing the thickness of the second thin wafer is similar.

According to the invention, when the wafer with the integrated circuit is processed to reduce the thickness of the wafer, and when the resultant thin wafer is treated, warping of the thin wafer can be prevented. Accordingly, the wafer stack where the thin wafers are layered for interconnection to form a wafer level package can be provided while effectively avoiding at least two prior art failure modes including cracking and breaking of the thin wafers.

BRIEF DESCRIPTION OF THE DRAWINGS

The above and other features and advantages of the invention will become more apparent by describing in detail exemplary embodiments thereof with reference to the attached drawings.

FIG. 15 is a schematic sectional view showing the first wafer joined to and layered on the second wafer according to a preferred embodiment of the invention.

DETAILED DESCRIPTION OF THE INVENTION

Figure 1:
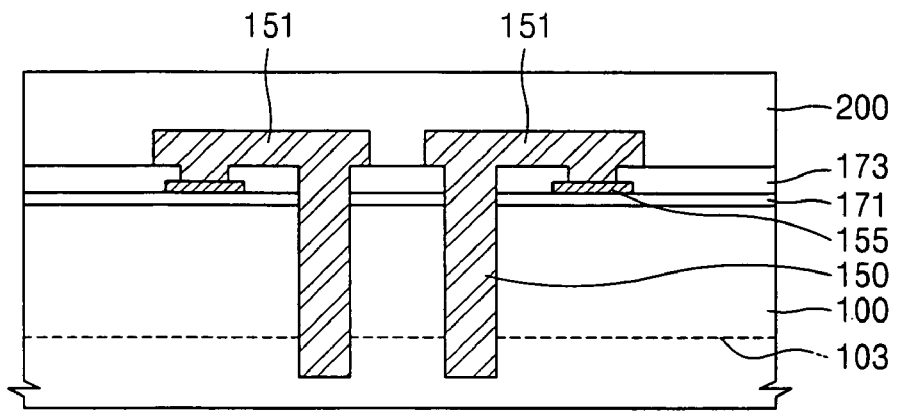
FIG. 1 is a schematic sectional view showing a stud-shaped bump used in a wafer stack forming method according to a preferred embodiment of the invention.

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In order to form a wafer level package, the invention forms a wafer stack in which thin wafers are connected to one another by electrically connecting one or more conductive bumps to one or more corresponding conductive connection pads. Before the wafer with an integrated circuit is stacked, the wafer is thinned by back-grinding and/or etching a back surface thereof to have a small thickness, for example, of only approximately several tens of μm.

By greatly reducing the wafer's thickness before the wafer is stacked, a wafer stack can be formed to have the wafers stacked in two or more layers. Thereafter, the wafer stack is cut, and separated, and the resulting individual stacked semiconductor chips are individually packaged.

However, a reliable and accurate wafer-thinning and stacking technique is needed. This is because thin wafers naturally tend to curve or warp into an out-of-planar configuration. When this phenomenon occurs, it becomes difficult to further process the wafer. Undesired failures such as wafer cracks or breaks occur, and the so-called 'bumps' that are used to interconnect the stacked semiconductor packages within the wafer stack are damaged.

In order to overcome these problems, the invention affixes a planar support member, or flat plate, a surface of each wafer to prevent the wafer from being warping or curving when each wafer is thinned. A circular glass plate can be used as the support member to planarize and support the wafer. Further, an expandable adhesive tape is used to affix the support member to the wafer.

The expandable adhesive tape has an expansion characteristic caused by light or heat of a specific wavelength, e.g. ultraviolet (UV).

The invention protrudes a stud-shaped bump from the thinned wafer to electrically interconnect the wafers that form the wafer stack. The bump extends at least partway through the wafer from a connection with the integrated circuit and protrudes slightly from an exterior surface of the wafer. The bump is exposed on the exterior surface by back-grinding and/or etching the surface. Preferably, the bump to both exterior surfaces of the thin wafer so that two terminals are exposed.

The wafer stack is formed to electrically contact a terminal of a bumper of one wafer with a corresponding terminal of a bump of another wafer. Further, a terminal of the bumper protrudes slightly from an exterior surface of the thinned wafer. The protruded bump from one wafer electrically contacts with a bump similarly formed in the other wafer. Preferably, a plurality of such corresponding bump pairs of adjacent wafers correspond with a plurality of chips on the surfaces of the wafers. Thus, a protruded bump can electrically connect either an entire wafer or plural ones of cut and separated chips to a carrier of the package. For example, a connection can be formed between a bump and a terminal such as the pad of a printed circuit board (PCB), carrier tape, a solder ball, etc.

Extending the stud-shaped conductive bump deep within the wafer is preferred as one method of electrically connecting the wafers, in the wafer stacking method according to the invention. Various methods of electrically connecting the integrated circuits of the stacked wafers are possible. However, if the support member is used to stabilize and planarize the wafer for thinning according to the invention, then it is advantageous that the stud-shaped bump within the thin wafer is formed to extend deep therein as described and illustrated herein.

FIG. 1 is a schematic sectional view illustrating the stud-shaped bump used in the wafer stack forming method according to a preferred embodiment of the invention.

The invented wafer stack forming method involves first preparing a wafer 100 to be stacked. It will be understood by those of skill in the art that the wafer 100, processed through a semiconductor device manufacture process, has a front, typically mirrored surface on which one or more integrated circuits are integrally formed.

A first insulating layer 171 is formed on the mirrored surface of the wafer 100. A connection pad 155 is provided on the first insulating layer 171 to be electrically connected with the integrated circuit disposed thereunder. The connection pad 155 provides a terminal to electrically connect the integrated circuit with an external cable, wiring harness or circuit. A second insulating layer 173 having a window to expose the connection pad 155 can also be provided. The first insulating layer 171 can be formed substantially of an insulating material such as a silicon oxide. The second insulating layer 173 can be formed of an insulating material such as a silicon nitride to protect the front surface of the wafer 100.

A via hole having a depth of several tens of micrometers (μm) is provided in the wafer 100, which has been processed through the semiconductor device manufacture process. The via hole can be formed using a mechanical hole forming process such as drilling. A conductive layer is formed to fill the via hole that extends deep within the wafer 100. Next, the conductive layer is patterned to form the stud-shaped bump 150 extending from the wafer's front surface.

Alternatively, when the conductive layer is formed, the conductive layer can be connected to the connection pad 155 of the wafer 100 through the window of the second insulating layer 173. Further, when the conductive layer is patterned, a connection portion 151 is rerouted to electrically connect the bump 150 with the connection pad 155. Accordingly, the integrated circuit formed in the wafer is electrically connected to the bump 150 by the connection pad 155 and the connection portion 151. The bump 150 preferably is formed of metal such as copper, aluminum, or gold.

In order to extend an end of the bump 150 toward the back of the wafer 100 and protrude it externally, the back surface of the wafer 100 is back-ground and etched. Accordingly, the end of the bump 150 protrudes beyond the new back surface 103 of the back-ground and etched wafer. The back-grinding and etching preferably is performed in a state while the wafer 100 is stabilized and planarized. This is accomplished, in accordance with the invention, by affixing a rigid, planar support member to the wafer, as will be seen.

A protruded portion of the bumper 150 from the back surface 103 of the wafer 100 is electrically connected to a connection portion of the bumper of another wafer when the wafer stack is formed. Or, the protruded portion of the bumper 150 is contacted and connected to the connection terminal such as the connection pad of the PCB or the carrier tape when the wafer stack or the individually separated chip stack is mounted on the PCB or the carrier tape.

FIGS. 2 through 14 are schematic perspective views illustrating a method of forming the wafer stack according to a preferred embodiment of the invention.

Figure 2:
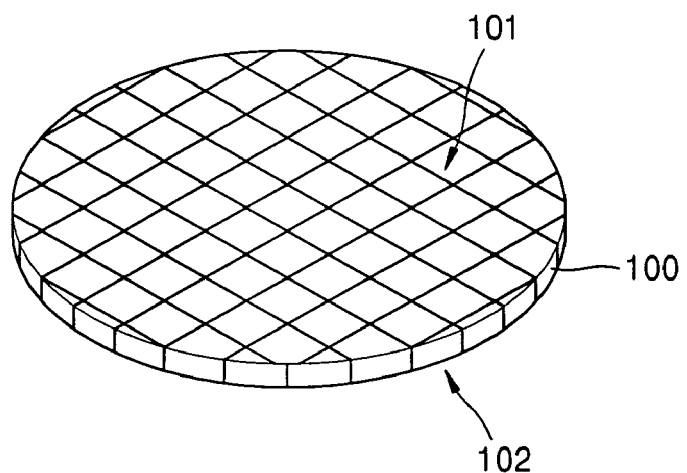
FIG. 2 is a schematic perspective view illustrating an operation of preparing a first wafer according to a preferred embodiment of the invention.

Referring to FIGS. 1 and 2, the first wafer (100 of FIG. 1) includes the stud-shaped bump (150 of FIG. 1) extended deep into the wafer 100 as shown. The bump connection portion 151 to connect the bump 150 to the connection pad 155 is provided on the front surface of the first wafer 100 as shown in FIG. 1, and the back surface 102 of the wafer 100 is opposite the front surface 101. The first wafer 100 is an upper one, for example, of two wafers constituting the wafer stack.

Figure 3:
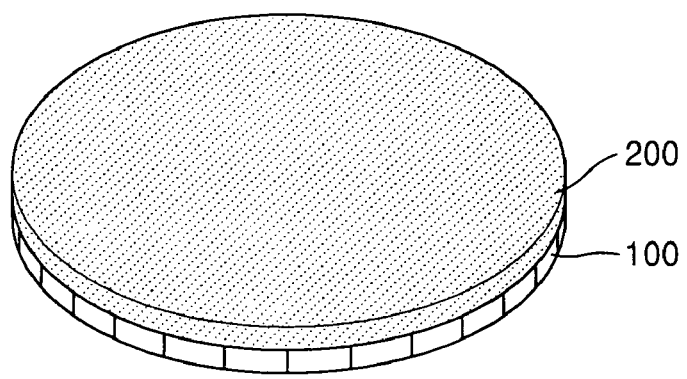
FIG. 3 is a schematic perspective view illustrating an operation of attaching a first adhesive tape to the first wafer according to a preferred embodiment of the invention.

FIG. 3 illustrates an operation of affixing a first adhesive tape 200 to the first wafer 100 according to a preferred embodiment of the invention.

The first adhesive tape 200 is attached to the first wafer 100 to cover the front surface 101 of the first wafer 100. The first adhesive tape 200 is used on the first wafer 100 to affix a flat plate as a support member. The expandable adhesive tape may be used as the first adhesive tape 200. The expandable adhesive tape can be easily separated when exposed to a specific wavelength of light, e.g., ultraviolet (UV) light or heat.

Figure 4:
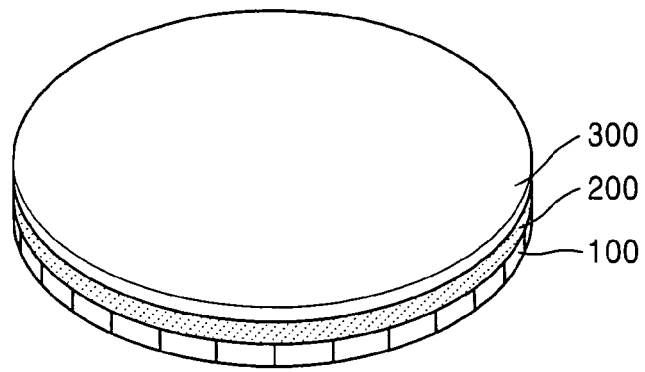
FIG. 4 is a schematic perspective view illustrating an operation of attaching a first support member to the first adhesive tape according to a preferred embodiment of the invention.

FIG. 4 illustrates an operation of affixing the first support member 300 to the first adhesive tape 200.

The circular, planar first support member 300 is affixed to the first adhesive tape 200. After the first wafer 100 is thinned, the first support member 300 functions to stabilize and planarize the first thin wafer, thereby preventing curving, cracking or breaking of the first thin wafer. The first support member 300 is a rigid planar member that functions to support and planarize the thin wafer to prevent its warping. The first support member 300 preferably is made of a circular-shaped glass plate so that the UV light can be transmitted therethrough to expand the first adhesive tape 200. Those of skill in the art will appreciate that alternative materials are contemplated, and are within the spirit and scope of the invention.

Figure 5:
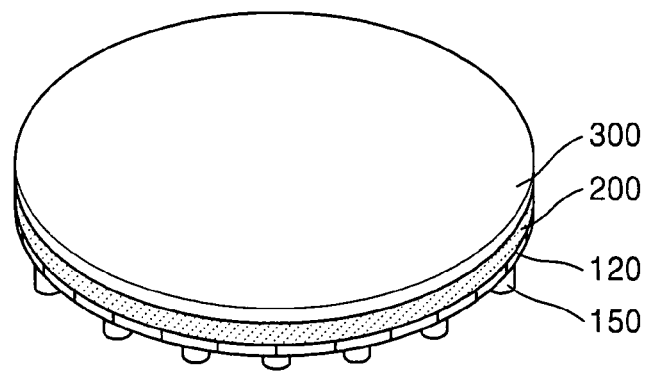
FIG. 5 is a schematic perspective view illustrating an operation of reducing the thickness of the first wafer according to a preferred embodiment of the invention.

FIG. 5 illustrates the operation of reducing the thickness of, i.e. thinning, the first wafer.

The first wafer 100 is ground at the back surface opposite which surface the first support 300 is affixed to reduce the first wafer 100 in thickness, thereby to form a first thin wafer 120. Preferably, the back-grinding is performed until the end of the stud-shaped bump (150 of FIG. 1) emerges or begins to protrude slightly. After the back-grinding, the first wafer 100 is selectively wet-etched at the back surface to protrude the end of the bump 150, as shown.

The thickness of the first thin wafer 120 varies depending upon the kind of wafer level package to be manufactured. Typically, the thickness might be approximately 50 μm to 60 μm. The protruded terminal portion of the bump 150 also varies depending upon the application, but typically might have a height of approximately 10 μm to 20 μm.

Thus, the first thin wafer 120 is made to include a plurality of bumps 150 that penetrate the first thin wafer 120 so that the ends of the bumps 150 are exposed as connection terminals at the back surface of the first thinned wafer 120.

Figure 6:
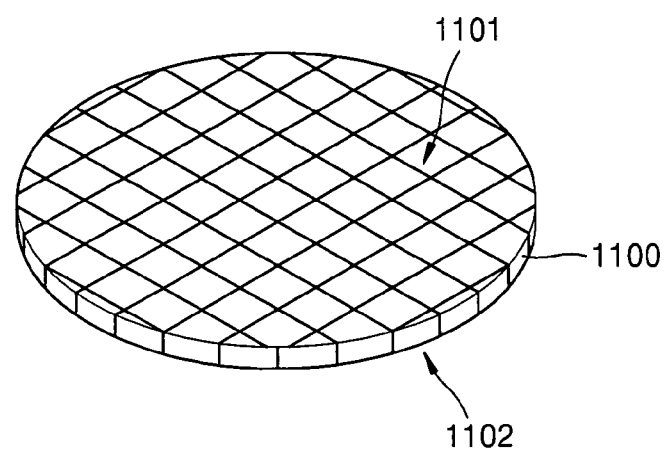
FIG. 6 is a schematic perspective view illustrating an operation of preparing a second wafer according to a preferred embodiment of the invention.

FIG. 6 illustrates an operation of preparing a second wafer 1100.

The second wafer 1100 is prepared similarly to the first. The second wafer 1100 includes a stud-shaped bump that preferably extends deep within the wafer 1100 at least to an internal region thereof. The second wafer 1100 typically includes one or more integrated circuits of the same kind as that of the first wafer (100 of FIG. 2), but it can instead include one or more integrated circuits of another kind or kinds. A bump connection part is formed at the front surface 1101 of the second wafer 1100 to connect the bump with the connection pad in the same method as shown in FIG. 1. The back surface 1102 of the wafer 1100 is opposite the front surface 1101. The second wafer 1100 is a lower one, for example, of two wafers constituting the wafer stack.

Figure 7:
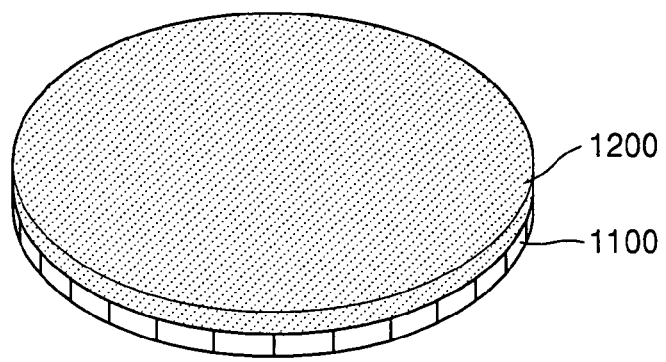
FIG. 7 is a schematic perspective view illustrating an operation of attaching a second adhesive tape to the second wafer.

FIG. 7 illustrates an operation of attaching a second adhesive tape 1200 to the second wafer 1100.

The second adhesive tape 1200 is affixed to the second wafer 1100 to cover the front surface 1101 of the second wafer 1100. In such a manner of the first adhesive tape 200 described with reference to FIG. 3, the second adhesive tape 1200 is used on the second wafer 1100 as an adhesive unit to affix a flat plate as a support member. The expandable adhesive tape preferably is used as the second adhesive tape 1200. The expandable adhesive tape can be easily separated when exposed to a specific wavelength of light, e.g., ultraviolet light, or heat.

Figure 8:
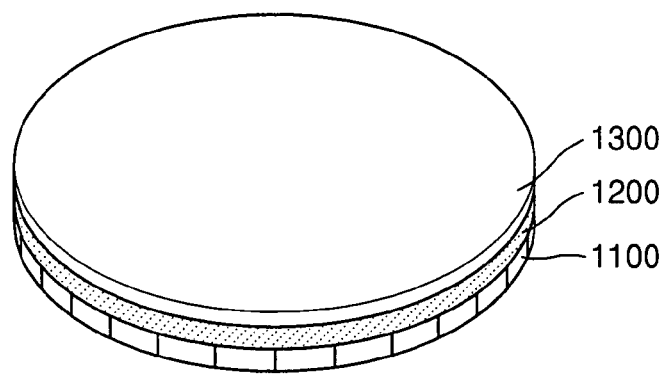
FIG. 8 is a schematic perspective view illustrating an operation of attaching a second support member to the second adhesive tape according to a preferred embodiment of the invention.

FIG. 8 illustrates an operation of affixing the second support 1300 to the second adhesive tape 1200.

The circular, planar second support member 1300 is affixed to the second adhesive tape 1200. After the second wafer 1100 is made thin, the second support 1300 functions to support the second wafer, thereby preventing curving or breaking of the second wafer. The second support 1300 is a rigid, planar member that functions to support and planarize the thin wafer while preventing its warping, in a manner similar to that of the first support 300. The second support 1300 preferably is made of a circular-shaped glass plate so that UV light can transmit therethrough when UV is applied to expand the second adhesive tape 1200.

Figure 9:
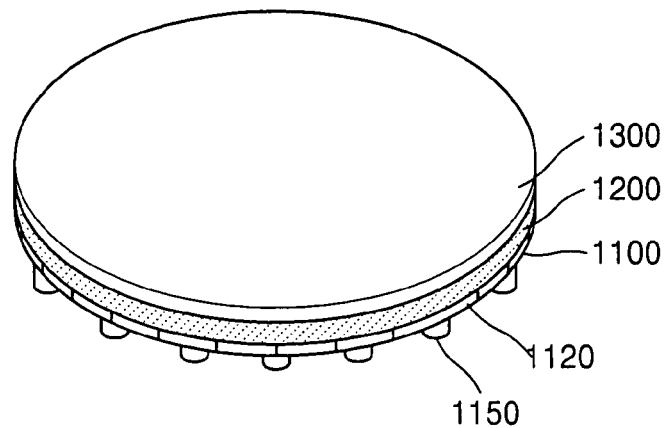
FIG. 9 is a schematic perspective view illustrating an operation of reducing the thickness of the second wafer according to a preferred embodiment of the invention.

FIG. 9 illustrates an operation of reducing the thickness of the second wafer 1100.

The second wafer (1100 of FIG. 8) is ground at the back surface 1103 opposite that front surface to which the second support 1300 is attached, thereby to reduce the second wafer 1100 in thickness and to form a second thin wafer 1120. Preferably, the back-grinding is performed until the end of the stud-shaped bump 1150 emerges or begins to protrude slightly from the thinned wafer surface. After the back-grinding, the second wafer 1100 is selectively wet-etched at the back surface to protrude the end of the second bump 1150 a desired height above the new back surface.

The thickness of the second thin wafer 1120 varies, depending upon the kind of wafer level package to be manufactured. Typically the thickness is approximately 50 μm to 60 μm. The protruded terminal portion of the second bump 1150 also is application-dependent, but typically is of a height of approximately 10 μm to 20 μm. Those of skill in the art will appreciate that any suitable dimensions are contemplated, and are within the spirit and scope of the invention.

Thus, the second thin wafer 1120 is made to include a plurality of bumps 1150 that penetrate the second thin wafer 1120 so that the ends of the bumps 1150 are exposed as connection terminals at the back surface of the second thin wafer 1120.

Figure 10:
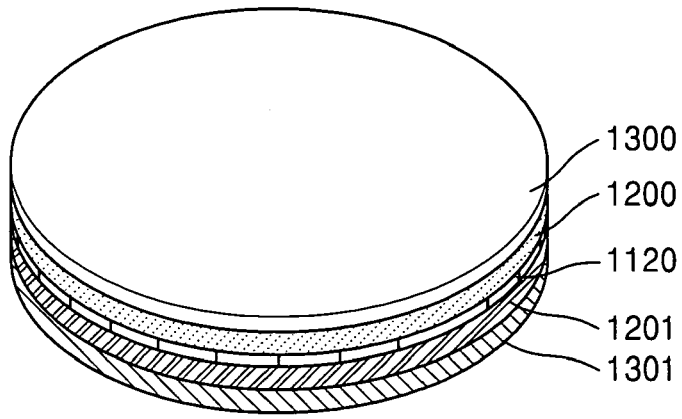
FIG. 10 is a schematic perspective view illustrating an operation of attaching a third adhesive tape and a third support to a back surface of the second wafer according to a preferred embodiment of the invention.

FIG. 10 illustrates an operation of attaching a third adhesive tape 1201 and a third support 1301 to the back surface of the second thin wafer 1120, according to one embodiment of the invention that contemplates optional stacking of more than two thin wafers in a wafer level package.

The third adhesive tape 1201 is affixed to the back surface of the second thin wafer 1120. Accordingly, the second bump 1150 protruded by the back-grinding and the etching of the second thin wafer 1120 is shielded and protected by the third adhesive tape 1201. Accordingly, in a subsequent wafer stacking process, the second bump 1150 can be effectively prevented from being damaged.

In such a manner of the second adhesive tape 1200, the third adhesive tape 1201 can be used on the second wafer 1100 as an adhesive unit to attach a flat plate as the support member. An expandable adhesive tape can be used as the third adhesive tape 1201.

The circular, planar third support member 1301 is attached to a back surface of the third adhesive tape 1201. The third support 1301 functions to support the second thin wafer 1120, thereby preventing warping, cracking or breaking of the second thin wafer 1120. The third support 1301 is a rigid, planar member that functions to planarize the second thin wafer 1120 while preventing warping thereof. The third support 1301 can be made of a circular-glass plate so that UV light can be transmitted through the third support 1301 when the UV is applied to expand the third adhesive tape 1201.

Figure 11:
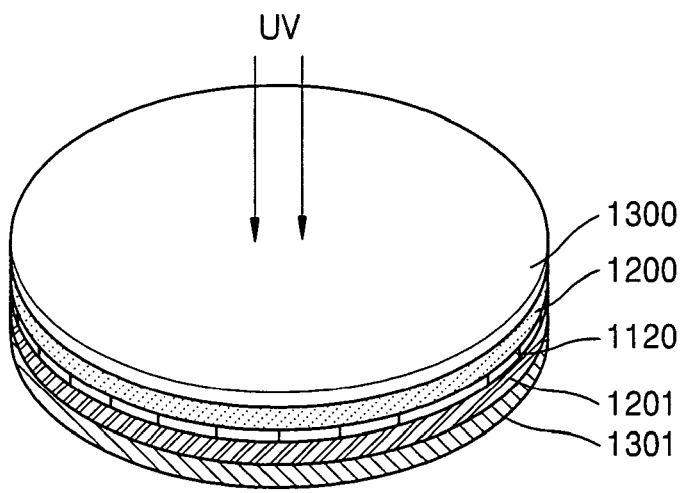
FIG. 11 is a schematic perspective view illustrating an operation of irradiating ultra violet light into the second adhesive tape according to a preferred embodiment of the invention.

FIG. 11 illustrates an operation of applying UV light or heat into the second adhesive tape 1200.

After the third support 1301 is attached to the back surface of the second thin wafer 1120, the second adhesive tape 1200 is removed to expose the front surface of the second thin wafer 1120. The second support 1300 is removed from the front surface of the second thin wafer 1120 by the removal of the second adhesive tape 1200.

If the second adhesive tape 1200 is formed using an UV expandable adhesive tape and the second support 1300 is formed using a transparent glass plate, then UV light, for example, is applied into the UV expandable second adhesive tape 1200 through the transparent glass plate. The UV radiation causes the second adhesive tape 1200 to expel gas, and the second adhesive tape 1200 is detached from the front surface of the second thin wafer 1120 together with the second support 1300. In case the second adhesive tape 1200 is formed using a heat-expandable adhesive tape, the second adhesive tape 1200 can be heated and expanded to detach the second adhesive tape 1200 and the second support 1300 from the front surface of the second thin wafer 1120.

Figure 12:
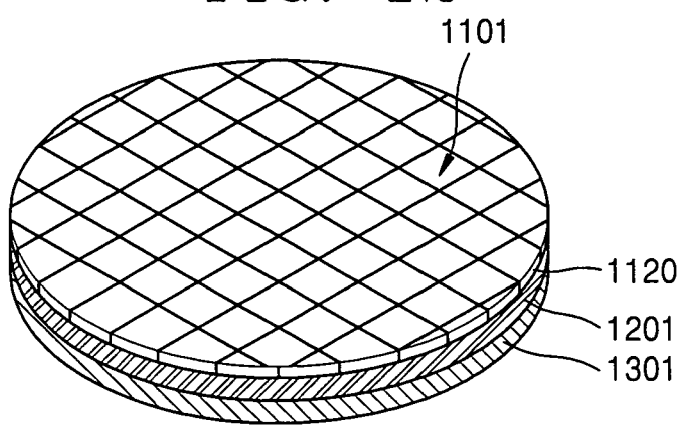
FIG. 12 is a schematic perspective view illustrating an operation of removing the second adhesive tape and the third support from the second wafer to expose the wafer's front surface according to a preferred embodiment of the invention.

FIG. 12 illustrates an operation of preparing the first thin wafer 1120 having the front surface 1101 exposed.

The second adhesive tape 1200 and the second support 1300 are removed to expose the front surface 1101 of the second thin wafer 1120 on which an integrated circuit pattern is formed. The front surface 1101 exposes a pattern such as the connection portion 151 of the bump connected to the connection pad 155, as shown in FIG. 1.

Figure 13:
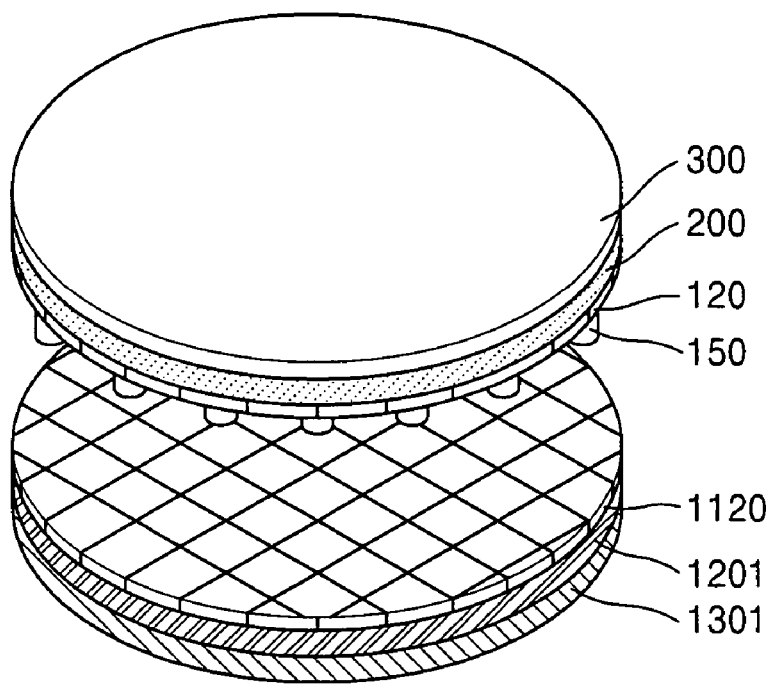
FIG. 13 is a schematic perspective view illustrating an operation of layering the first wafer on the second wafer according to a preferred embodiment of the invention.
Figure 14:
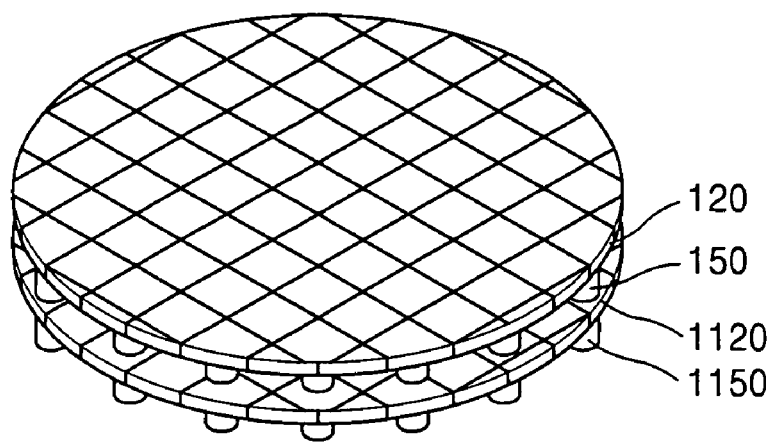
FIG. 14 is a schematic perspective view illustrating an operation of removing the first support and the third support from the stacked first and second wafers according to a preferred embodiment of the invention.

FIG. 13 illustrates an operation of layering the first thin wafer 120 onto the second thin wafer 1120. FIG. 14 illustrates an operation of removing the first support 300 and the third support 1301. FIG. 15 illustrates a layered junction between, or joining of, the first thin wafer 120 and the second thin wafer 1120.

Referring to FIG. 13, the first thin wafer 120 prepared as in FIG. 5 is aligned and layered on the second thin wafer 1120 prepared as in FIG. 12. First, the exposed back surface of the first thin wafer 120 is accurately aligned to face the exposed front surface of the second thin wafer 1120. As shown in FIG. 15, the exposed terminal of the first bump 150 of the first thin wafer 120 is aligned to its corresponding exposed connection portion 1151 of the second bump 1150 of the second thin wafer 1120 to align the first thin wafer 120 on the second thin wafer 1120.

After that, the first thin wafer 120 is junctioned or joined to the second thin wafer 1120 to form the wafer stack wherein the first thin wafer 120 and the second thin wafer 1120 are layered and attached to each other. The junction can be accomplished via any suitable method. Preferably, as shown in FIG. 15, the exposed terminal of the first bump 150 of the first thin wafer 120 is electrically connected with its corresponding exposed connection portion 1151 of the second bump of the second thin wafer 1120 to electrically connect the first bump 150 with the second bump 1150.

The second bump 1150 may also be connected to the second connection pad 1155, which is formed on a third insulating layer 1171 of the second thin wafer 1120, through the window provided in a fourth insulating layer 1173. Accordingly, an electric signal conveyed through the second bump 1150 is conveyed also to the second connection pad 1155 of the second wafer, and is also conveyed to the first connection pad 155 of the first thin wafer 120 through the first bump 150.

As an example of embodying the electrical connection of the bumps 150 and 1150 and the adhesion of the wafers 120 and 1120, an anisotropic conductive film (ACF) can be used. For example, the anisotropic conductive film is attached to the front exposed surface of the second thin wafer 1120. The anisotropic conductive film 1120 is in contact with the connection portion 1151 of the second bump patterned and exposed at the front surface of the second thin wafer 1120. The protruded terminal of the first bump 150 of the first thin wafer 120 is in contact with the anisotropic conductive film, and the first thin wafer 120 is pressed and junctioned or joined with the second thin wafer 1120. Accordingly, the anisotropic conductive film is electrically connected to the first bump 150 and the second bump 1150.

Alternatively, an anisotropic conductive paste (ACP) is coated on the exposed front surface of the second thin wafer 1120, and the first thin wafer 120 is pressed and attached and then the coated anisotropic conductive paste is cured to form the junction or joining, i.e., electrical interconnect, of the first thin wafer 120 and the second thin wafer 1120.

Alternatively, a solder paste is used to form the junction of the first thin wafer 120 and the second thin wafer 1120. First, the solder paste is coated on the second thin wafer 1120 in a selective coating method such as screen printing. The solder paste is selectively coated to form an electrical junction 400 as shown in FIG. 15. After the solder paste is selectively coated on the connection portion 1151 of the second bump, and the protruded terminal portion of the first bump 150 is in contact with the coated solder paste, the solder paste is reflowed. Accordingly, as shown in FIG. 15, the protruded terminal portion of the first bump 150 and the connection portion 1151 of the second bump are electrically connected, and an electrical junction is formed for junctioning or joining the first thin wafer 120 and the second thin wafer 1120.

Since the wafers 120 and 1120 are supported by the supports 300 and 1301 even in the process of junctioning or joining the wafers 120 and 1120, the thin wafers 120 and 1120 are prevented from warping, cracking or breaking. Specifically, a process of reflowing the solder paste and the like includes a heating process, and heretofore had a high probability that the thin wafers were undesirably warped. However, since the thin wafers 120 and 1120 in accordance with an aspect of the invention are supported by the support members 300 and 1301, the thin wafers 120 and 1120 can be continuously maintained in a rigid, planar configuration even during the reflowing process. Accordingly, the wafers 120 and 1120, in accordance with the invention, are effectively prevented from damage.

After the wafers 120 and 1120 are junctioned or joined as described above, the first support member 300 and the third support member 1301 are removed from the wafers 120 and 1120 to form the wafer stack as shown in FIG. 14. In such a manner of the description referring to FIG. 11, UV light or heat is applied to the first adhesive tape 200 or/and the third adhesive tape 1201 to separate the first adhesive tape 200 or/and the third adhesive tape 1201 from the wafers 120 and 1120. Accordingly, the first support member 300 and the third support member 1301 are detached from the wafers 120 and 1120.

Alternatively, FIG. 14 illustrates the wafer stack where two sheets of the thin wafers 120 and 1120 are layered, but it is possible to stack the wafers more than two high by repeating the processes described up to now, as will be understood by those of skill in the art.

After the wafer stack is formed, a process of packaging a semiconductor device can be subsequently performed. For example, known packaging process steps can be performed so that, after the wafer stack is individually separated into the chip stacks, the separated chip stacks are mounted on a PCB or carrier tape. Alternatively, the known packaging process can be performed so that, after the wafer stack is mounted on the PCT or the carrier tape, the mounted wafer stack is individually separated into plural, individual semiconductor device stacks.

Thus, a method of forming a wafer stack according to another embodiment of the invention includes: preparing a first thin wafer to produce a first bump to protrude from a rear surface thereof; preparing a second wafer to produce a second bump to protrude from a front surface where the second bump extends from an internal region thereof; attaching a first support member to the front surface of the second wafer; reducing the second wafer in thickness to form a second thin wafer so that a lower end of the second bump protrudes also from a back surface of the second thin wafer; attaching a second support member to the back surface of the second thin wafer; removing the first support from the second thin wafer to expose an upper end of the second bump; aligning and joining the first thin wafer to the second thin wafer so that the first bump is electrically connected to the upper end of the second bump; and removing the second support from the second thin wafer to expose the lower end of the second bump.

A method of forming a wafer stack according to yet another embodiment of the invention includes: preparing a first wafer to produce a first bump to extended to a front surface from an internal region thereof; affixing a first support member to the front surface of the first wafer; reducing the first wafer in thickness to form a first thin wafer so that a lower end of the first bump protrudes from a back surface of the first thin wafer; preparing a second wafer to produce a second bump to extend from a front surface to an internal region thereof; affixing a second support to the front surface of the second wafer; reducing the second wafer in thickness to form a second thin wafer so that a lower end of the second bump protrudes from a back surface of the second thin wafer; affixing a third support member to the back surface of the second thin wafer; removing the second support member from the second thin wafer to expose an upper end of the second bump; aligning and joining the first thin wafer to the second thin wafer so that the first bump is electrically connected to the upper end of the second bump; removing the first support member from the first thin wafer to expose the upper end of the first bump; and removing the third support member from the second thin wafer to expose the lower end of the second bump.

Alternatively, a method of forming a wafer stack according to still another embodiment of the invention includes: preparing a first thin wafer to produce a first bump to protrude from a front surface and to extend to a back surface thereof, the first bump configured to allow a first support member to be affixed to the front surface thereof; preparing a second thin wafer to allow a second bump to penetrate from a front surface to a back surface thereof, the second bump configured to allow a second support member to be affixed to the back surface thereof; aligning and joining the first thin wafer to the first thin wafer so that a lower end of the first bump is electrically connected to an upper end of the second bump; removing the first support member from the first thin wafer; and removing the second support member from the second thin wafer.

As described above, the invention can provide the wafer level stack to greatly reduce a process time in comparison with an individual chip stacking process that can proceed only after the wafer is sawed and whereby each of the individually separated chips must be individually stacked.

Due to the stabilizing and planarizing wafer support member, risk included in downstream processing of the wafer can be greatly reduced. Accordingly, it is possible to manufacture a wafer level stack of the thin wafers that involves reducing the wafer in thickness, yet without risk of cracking or breaking the wafers due to out-of-planar stresses thereon. Accordingly, after the wafers are stacked, the wafers are reduced in thickness, and failure modes such as a wafer edge crack and bump damage are prevented. Specifically, the warping of the wafer caused by thinning thereof is effectively prevented.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method of forming a stack of wafers, comprising:
   providing a first wafer to produce a first bump that extends at least partway through the first wafer and protrudes from a front surface thereof;
   affixing a support member to the front surface of the first wafer after providing the first wafer;
   reducing a thickness of the first wafer to form a first thinned wafer, wherein a lower end of the first bump protrudes from a rear surface of the first thinned wafer;
   providing a second wafer to produce a second bump that protrudes from a front surface thereof;
   joining the first thinned wafer and the second wafer so that the protruded lower end of the first bump is electrically connected to the protruding second bump; and
   completely removing the support member from the first thinned wafer.

2. The method of claim 1, wherein the support member includes a glass plate.

3. The method of claim 1, wherein the affixing includes applying an expandable adhesive layer between the first thinned wafer and the support member.

4. The method of claim 3, wherein the removing of the support includes applying heat or ultraviolet (UV) light into the expandable adhesive layer to remove the expandable adhesive layer and the support member.

5. The method of claim 1, wherein the reducing of the thickness of the rear surface of the first wafer comprises:
   grinding the rear surface of the first wafer opposite the support member to expose a surface of the lower end of the first bump; and
   selectively etching the ground rear surface of the first wafer to protrude the lower end of the first bump from the ground rear surface of the first thinned wafer.

6. The method of claim 1, wherein the joining of the first thinned wafer and the second wafer comprises:
   attaching an anisotropic conductive film (ACF) between the first thinned wafer and the second wafer; and
   aligning and pressing together to join the first thinned wafer and the second wafer.

7. The method of claim 1, wherein the joining of the first thinned wafer and the second wafer comprises:
   applying an anisotropic conductive paste (ACP) to the front surface of the second wafer;
   aligning and pressing together the first thinned wafer and the second wafer; and
   curing the ACP.

8. The method of claim 1, wherein the joining of the first thinned wafer and the second wafer comprises:
   aligning the second bump to be opposite the lower end of the first bump;
   selectively coating a solder paste on the second bump opposite the lower end of the first bump; and
   contacting the lower end of the first bump with the coated solder paste and reflowing the coated solder paste to form an electrical connection between the first bump and the second bump.

9. The method of claim 8, wherein the solder paste is selectively coated on the first thinned wafer by screen printing.

10. A method of forming a stack of wafers, the method comprising:
    providing a first wafer to produce a first bump that extends at least partway therethrough and protrudes from a back surface thereof;
    providing a second wafer to produce a second bump that extends at least partway therethrough and protrudes from a front surface thereof;
    affixing a first support member to the front surface of the second wafer after providing the second wafer;
    reducing the second wafer in thickness to form a second thinned wafer so that a lower end of the second bump protrudes also from a rear surface of the second thinned wafer;
    attaching a second support member to the rear surface of the second thinned wafer;
    completely removing the first support member from the second thinned wafer to expose an upper protruded end of the second bump;
    joining the first wafer and the second thinned wafer so that the first bump is electrically connected to the upper end of the second bump; and
    completely removing the second support member from the second thinned wafer to expose the lower end of the second bump.

11. The method of claim 10, wherein affixing the first support member includes affixing a first expandable adhesive layer to the front surface of the second thinned wafer to affix the first support member thereto.

12. The method of claim 11, wherein the removing of the first support member includes applying heat or ultraviolet (UV) light into the first expandable adhesive layer to remove the first expandable adhesive layer and the first support member.

13. The method of claim 10, wherein the affixing the second support member includes affixing a second expandable adhesive layer to the rear surface of the second thinned wafer to affix the second support member thereto.

14. The method of claim 13, wherein the removing of the second support member includes applying heat or ultraviolet (UV) light into the second expandable adhesive layer to remove the second expandable adhesive layer.

15. The method of claim 10, wherein the reducing of the thickness of the second wafer comprises:
    grinding a rear surface of the second wafer opposite the first support member to expose a surface of the lower end of the second bump; and
    selectively etching the rear surface of the ground second wafer to protrude the lower end of the second bump from the rear surface of the second thinned wafer.

16. A method of forming a stack of wafers, the method comprising:
    providing a first wafer to produce a first bump that extends at least partway through the first wafer and protrudes from a front surface thereof;

affixing a first support member to the front surface of the first wafer after providing the first wafer;

reducing the first wafer in thickness to form a first thinned wafer so that a lower end of the first bump protrudes from a rear surface of the first thinned wafer;

providing a second wafer to produce a second bump that extends at least partway through the second wafer and protrudes from a front surface thereof;

affixing a second support member to the front surface of the second wafer after providing the second wafer;

reducing the second wafer in thickness to form a second thinned wafer so that a lower end of the second bump protrudes from a rear surface of the second thinned wafer;

attaching a third support member to the rear surface of the second thinned wafer;

completely removing the second support member from the second thinned wafer to expose an upper end of the second bump;

joining the first thinned wafer and the second thinned wafer so that the first bump is electrically connected to the upper end of the second bump; and completely removing the first support member from the first thinned wafer to expose an upper end of the first bump and completely removing the third support member from the second thinned wafer to expose the lower end of the second bump.

17. The method of claim 16, wherein at least one of the first, second, and third supports includes a glass plate.

18. The method of claim 16, wherein at least one of the first, second, and third support members is affixed to the wafer by an expandable adhesive layer.

19. The method of claim 18, wherein at least one of the first, second, and third support members is removed by applying heat or ultraviolet (UV) light into the expandable adhesive layer to remove the expandable adhesive layer and the at least one support member.

20. The method of claim 16, wherein the reducing of the thickness of the second wafer comprises:

grinding a rear surface of the second wafer opposite the first support member to expose a surface of the lower end of the second bump; and selectively etching the rear surface of the ground second wafer to protrude the lower end of the second bump from the rear surface of the second thinned wafer.

21. A method of forming a stack of wafers, the method comprising:

preparing a first wafer to produce a first bump extending at least partway through the first wafer and protruding from a rear surface thereof;

after preparing the first wafer, affixing a first support member to a front surface of the first wafer;

preparing a second wafer to produce a second bump extending at least partway through the second wafer and protruding from a front surface thereof;

after preparing the second wafer, affixing a second support member to a rear surface of the second wafer;

joining the first wafer and the second wafer so that a lower end of the first bump is electrically connected to an upper end of the second bump; and completely removing the first and second support members from the first and second wafers.

22. The method of claim 21, wherein at least one of the first and second support members includes a glass plate.

23. The method of claim 21, wherein at least one of the first and second support members is affixed to a wafer by an expandable adhesive layer.

* * * * *